US009394625B2

(12) United States Patent
Luo et al.

(10) Patent No.: US 9,394,625 B2
(45) Date of Patent: Jul. 19, 2016

(54) METHOD FOR MANUFACTURING CARBON NANOTUBES

(71) Applicants: Tsinghua University, Beijing (CN); HON HAI PRECISION INDUSTRY CO., LTD., New Taipei (TW)

(72) Inventors: Chun-Xiang Luo, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 295 days.

(21) Appl. No.: 14/224,085

(22) Filed: Mar. 25, 2014

(65) Prior Publication Data

US 2014/0205765 A1   Jul. 24, 2014

Related U.S. Application Data

(63) Continuation of application No. 13/298,288, filed on Nov. 17, 2011, now abandoned.

(30) Foreign Application Priority Data

Sep. 14, 2007 (CN) .......................... 2007 1 00771127

(51) Int. Cl.
*C30B 29/60* (2006.01)
*C01B 31/02* (2006.01)
(Continued)

(52) U.S. Cl.
CPC ............... *C30B 29/602* (2013.01); *B82Y 30/00* (2013.01); *B82Y 40/00* (2013.01); *C01B 31/0206* (2013.01);
(Continued)

(58) Field of Classification Search
CPC .......... B82Y 30/00; B82Y 40/00; B82Y 5/00; B82Y 10/00; B82Y 15/00; B82Y 20/00; B82Y 25/00; B82Y 35/00; B82Y 99/00; C01B 31/0206; C01B 31/0226; C01B 31/022; C01B 31/0233; C01B 31/024; C01B 31/0246; C01B 31/0253; C01B 31/026; C01B 31/0266; C01B 31/0273; C01B 31/028; C01B 31/0286; C01B 31/0293; C01B 2202/00; C01B 2202/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/30; C01B 2202/32; C01B 2202/34; C01B 2202/36; C30B 25/16; C30B 29/605; C30B 35/00; C30B 29/602; Y10S 977/84; D01F 9/10; D01F 9/127; D01F 9/1271; D01F 9/1272; D01F 9/1273; D01F 9/1274; D01F 9/1275; D01F 9/1276; D01F 9/1277; D01F 9/1278

USPC ........ 423/447.1–447.3, 445 B; 977/742–754, 977/842–848

See application file for complete search history.

(56) References Cited

U.S. PATENT DOCUMENTS 7,780,940 B2 *  8/2010  Chen .................... D01F 9/12
                                                         423/445 B
7,926,440 B1 *  4/2011  Tombler, Jr. ........... B82Y 30/00
                                                         118/59

OTHER PUBLICATIONS

Alexandrescu, et al., Syntthesis of carbon nanotubes by CO2-laser-assisted chemical vapour deposition, Infrared Physics & Technology 2003; 44: 43-50.*

(Continued)

*Primary Examiner* — Daniel C McCracken
(74) *Attorney, Agent, or Firm* — ScienBiziP, P.C.

(57) ABSTRACT

A method for manufacturing carbon nanotubes is provided. First, a substrate having a first surface and a second surface opposite to the first surface is provided. Second, a catalyst film is formed on the first surface of the substrate, wherein the catalyst film comprises a carbonaceous material. Third, a mixture of a carrier gas and a carbon source gas is flew across the catalyst film. Forth, a focused laser beam is irradiated on the substrate to grow a carbon nanotube array from the substrate.

15 Claims, 4 Drawing Sheets

(51) Int. Cl.
  *B82Y 30/00* (2011.01)
  *B82Y 40/00* (2011.01)
  *C30B 25/16* (2006.01)
  *C30B 35/00* (2006.01)

(52) U.S. Cl.
  CPC ............ *C01B 31/0226* (2013.01); *C30B 25/16* (2013.01); *C30B 29/605* (2013.01); *C30B 35/00* (2013.01); *Y10S 977/84* (2013.01)

(56) References Cited

OTHER PUBLICATIONS

Bondi, et al., Laser assisted chemical vapor deposition synthesis of carbon nanotubes and their characterization, Carbon 2006; 44: 1393-1403.*

Kanzow, Laser-assisted production of multi-walled carbon nanotubes from acetylene, Chemical Physics Letters 1998; 295: 525-530.*

Kwok, et al., Growth of carbon nanotubes by open-air laser-induced chemical vapor depoistion, Carbon 2005; 43: 437-446.*

Rohmund, et al., Carbon nanotube films grown by laser-assisted chemical vapor deposition, J. Vac. Sci. Technol. B 2002; 20(3): 802-811.*

Shi, et al., Direct synthesis of single-walled carbon nanotubes bridging metal electrodes by laser-assisted chemical vapor deposition, Applied Physics Letters 2006; 89: 083105-1 to 083105-3.*

* cited by examiner

METHOD FOR MANUFACTURING CARBON NANOTUBES

RELATED APPLICATIONS

This application is a continuation of U.S. patent application Ser. No. 13/298,288, filed on Nov. 17, 2011, entitled, "METHOD FOR MANUFACTURING CARBON NANOTUBES". The disclosures of the above-identified applications are incorporated herein by reference.

BACKGROUND

1. Field of the Invention

The invention relates to method for manufacturing carbon nanotubes.

2. Discussion of Related Art

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). CNTs are electrically conductive along their length, chemically stable, and each can have a very small diameter (much less than 100 nanometers) and large aspect ratios (length/diameter). Due to these and other properties, it has been suggested that CNTs can play an important role in fields such as microscopic electronics, field emission devices, thermal interface materials, etc.

Generally, there are three conventional methods for manufacturing CNTs. The first method is the arc discharge method, which was first discovered and reported in an article by Sumio Iijima entitled "Helical Microtubules of Graphitic Carbon" (Nature, Vol. 354, Nov. 7, 1991, pp. 56-58). The second method is the laser ablation method, which was reported in an article by T. W. Ebbesen et al. entitled "Large-scale Synthesis of Carbon Nanotubes" (Nature, Vol. 358, 1992, pp. 220). The third method is the chemical vapor deposition (CVD) method, which was reported in an article by W. Z. Li entitled "Large-scale Synthesis of Aligned Carbon Nanotubes" (Science, Vol. 274, 1996, pp. 1701). The CVD method is advantageously useful in synthesis of an array of carbon nanotubes and is advantageous in mass production, improved length controllability, compatibility with conventional integrated circuit process, etc.

Figure 1:
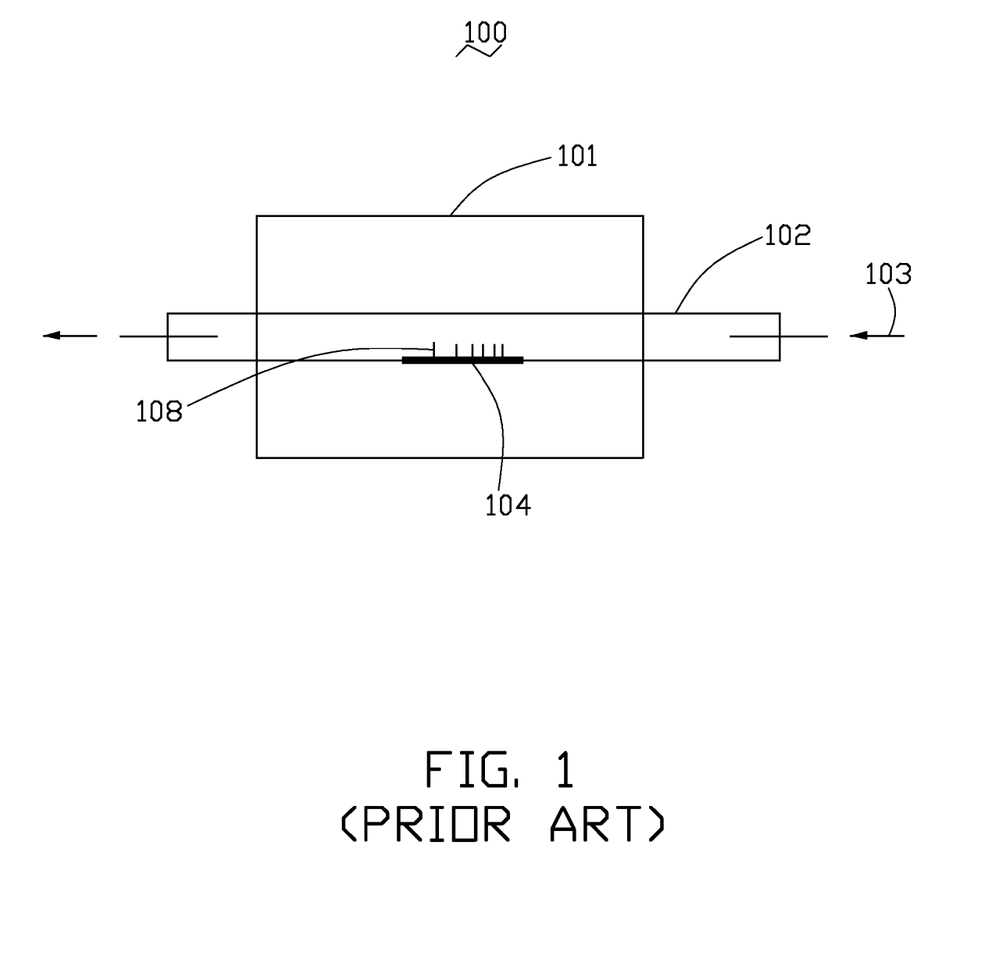
FIG. 1 is a schematic structure diagram of an apparatus using a thermal CVD method for growing carbon nanotubes, using conventional technology.

Generally, the mainly used CVD method for making CNTs is the thermal CVD. FIG. 1 (related art) shows a schematic structure diagram of growth apparatus 100 using the thermal CVD to grow CNTs. The method using the growth apparatus 100 includes the following steps. Firstly, a heating furnace 101 is used to heat a reaction room 102, thus the temperature of the reaction room 102 reaches a pre-determined temperature to grow CNTs 108. The pre-determined temperature is in the approximate range from 500° C. to 1200° C. Secondly, a carbon source gas 103, which is mixed with a carrier gas, is introduced flowing over the catalyst film for growing the CNTs 108 on a substrate 104. Due to catalyzing by the catalyst film, the carbon source gas 103 supplied over the catalyst film is pyrolized in a gas phase into carbon units (C=C or C) and free hydrogen (H2). The carbon units are absorbed on a free surface of the catalyst film and diffused into the catalyst film. When the catalyst film is supersaturated with the dissolved carbon units, carbon nanotube growth is initiated. As the intrusion of the carbon units into the catalyst film continues, an array of carbon nanotubes is formed. Single-walled carbon nanotubes, double-walled carbon nanotubes, multi-walled carbon nanotubes, and the corresponding carbon nanotube array can be achieved by the above-described method.

In addition, there is a laser-induced chemical vapor deposition method (Laser-Induced Chemical Vapor Deposition, LICVD), which is an advanced method based on the traditional thermal chemical vapor deposition method. The advancement of LICVD is used a laser to replace the heating furnace 101. Thus, the CNTs can be grown at a fixed point and a low temperature by the LICVD.

With the continuous development of methods for growing CNTs, the CVD growth technology, in laboratory and large-scale industrial production, has matured considerably. Thus, carbon-nanotube-based field emission devices, electronic devices, thermal conductivity devices, and composite materials have been extensively investigated and gradually applied. The current apparatus for growing CNTs generally can only be used for growing carbon nanotubes. It cannot be used to observe the whole growth process of CNTs, and thus it is not easy to control the growth process of CNTs. In addition, how the growth of CNTs proceeds and how such applications may be integrated to reduce the growth process and the application process are major research issues nowadays, as such issues directly impact cost and time of production. A real-time method of positioning and/or monitoring in-situ growth is a potential solution to solve the above-described problems.

What is needed, therefore, is an in-situ method for growing carbon nanotubes that facilitates real-time positioning and monitoring during growth thereof.

Other advantages and novel features of the present apparatus for manufacturing carbon nanotubes will become more apparent from the following detailed description of present embodiments when taken in conjunction with the accompanying drawings.

BRIEF DESCRIPTION OF THE DRAWINGS

Many aspects of the present apparatus for manufacturing carbon nanotubes can be better understood with reference to the following drawings. The components in the drawings are not necessarily to scale, the emphasis instead being placed upon clearly illustrating the principles of the present apparatus for manufacturing carbon nanotubes.

Corresponding reference characters indicate corresponding parts throughout the several views. The exemplifications set out herein illustrate at least one present embodiment for manufacturing carbon nanotubes, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present apparatus for manufacturing carbon nanotubes.

Figure 2:
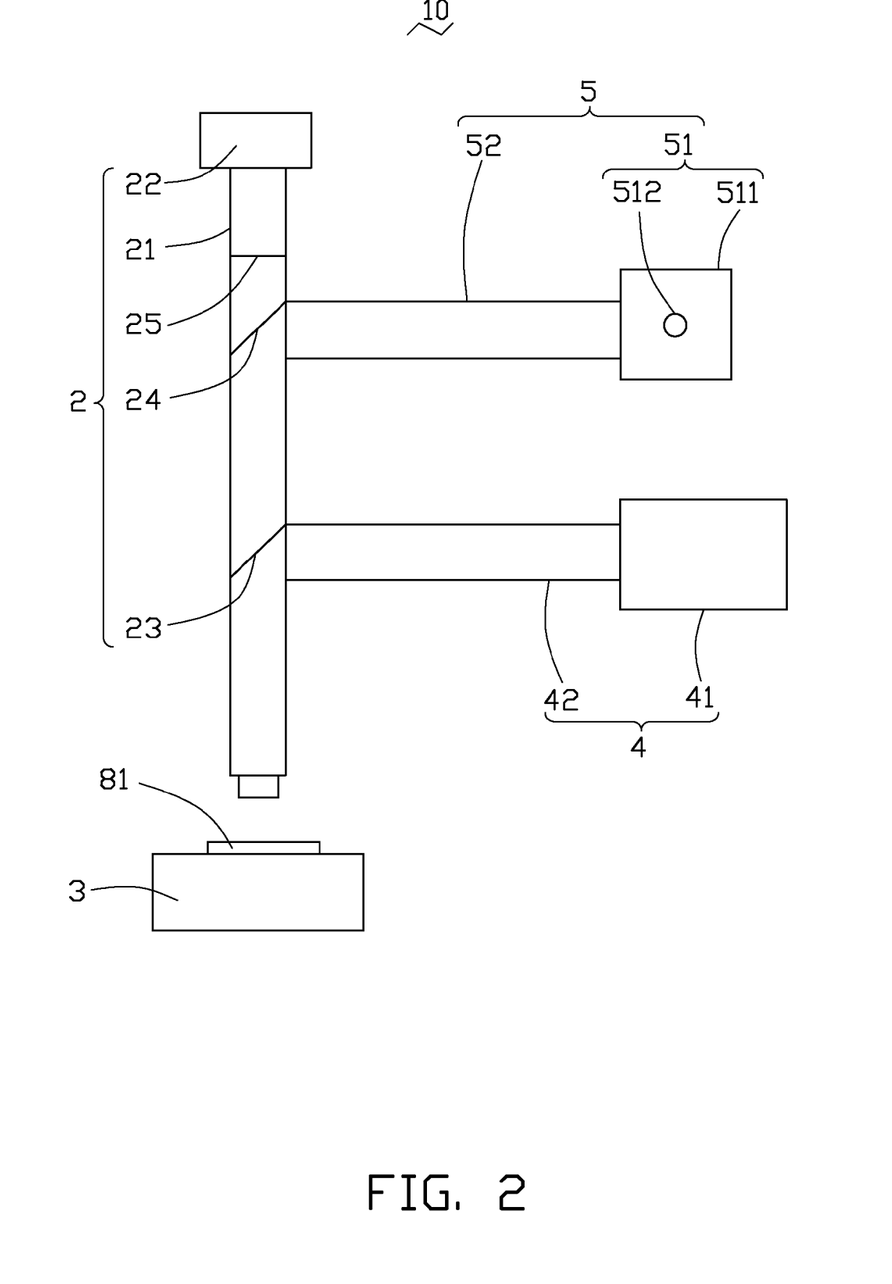
FIG. 2 is a schematic structure diagram of the apparatus using LICVD method for growing carbon nanotubes, in accordance with a present embodiment.
Figure 3:
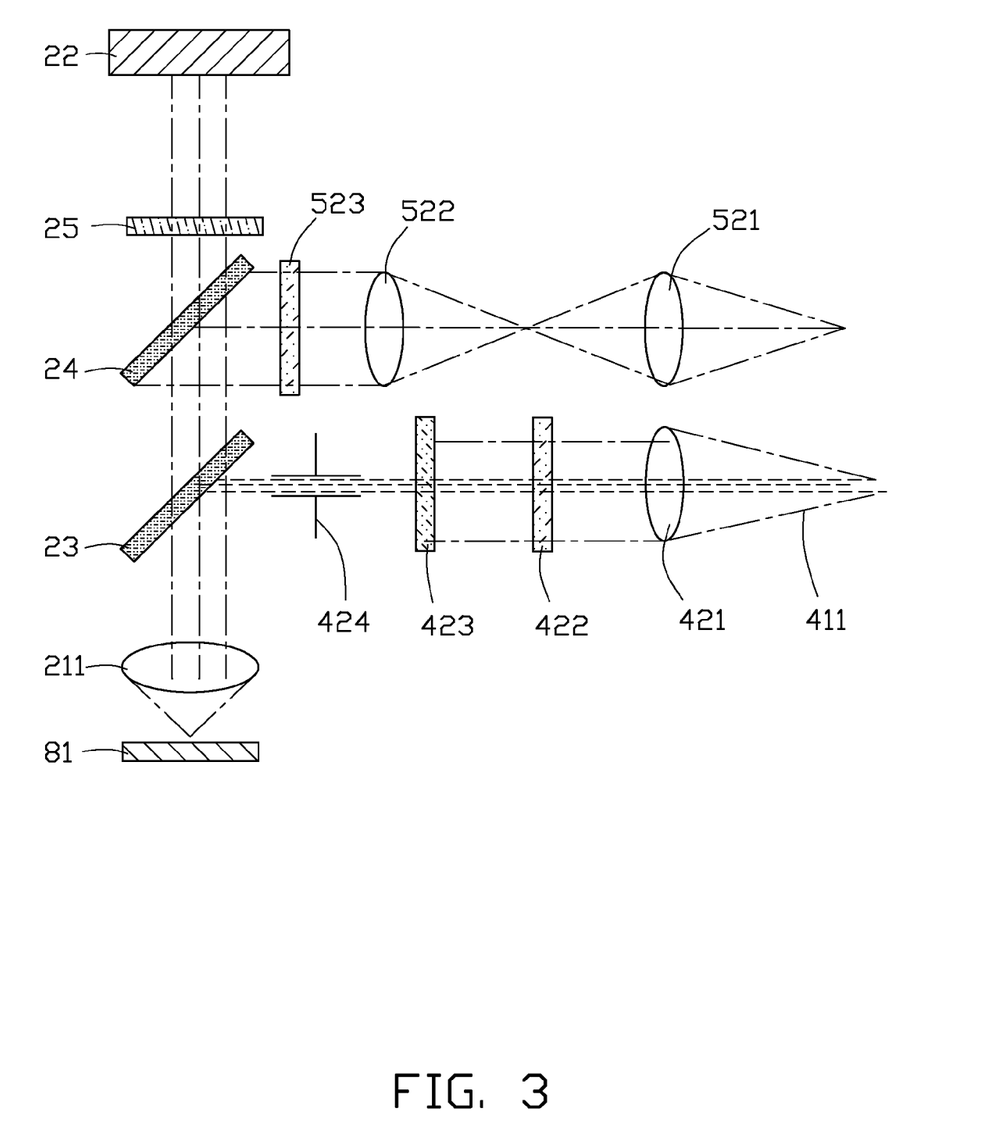
FIG. 3 is an optically schematic diagram of the apparatus using LICVD method for growing carbon nanotubes, in accordance with the present embodiment.

Referring to FIGS. 2 and 3, the apparatus for manufacturing carbon nanotubes 10 includes an observation device 2, a work stage 3, a laser device 4, and a lighting device 5. The observation device 2 includes an observation tube 21, an observation window 22 arranged on the top of the observation tube 21, a first half-reflecting, pellicle mirror 23 installed with an angle of 45° to the observation tube 21, and a second half-reflecting, pellicle mirror 24 installed parallel to the first half-reflecting, pellicle mirror 23. The work stage 3 is disposed under and is separated from the observation tube 21 with a certain distance. The laser device 4 is arranged perpendicular to the observation device 2 and corresponds to (i.e., is directed/aimed toward) the first half-reflecting, pellicle mirror 23. The lighting device 5 is arranged perpendicular to the observation device 2 and corresponds to (i.e., is directed/aimed toward) the second half-reflecting, pellicle mirror 24. The observation device 2, the laser device 4, and the lighting device 5 are optically conjugated with one another. The work stage 3 is selectably positionable below the observation tube 21 and within the optical path thereof.

The observation window 22 usefully is a detector with a shutter, e.g., a charge coupled device (CCD). The CCD detector advantageously has a thermoelectric refrigeration, a large dynamic range, and/or a high sensitivity. Specific parameters of the CCD detector are as the following: 16 bits AD conversion, dynamic range up to 18,750 using a line-scan mode, dynamic range up to 75,000 using a surface-scan mode, 532× 520 pixel resolving ratio, and more than 90% quantum efficiency. The morphology of a sample can be observed or recorded using the CCD detector in order to supervise surface morphology changes to be made on and/or in association with the sample. In addition, the observation window 22 can also be a lens similar to an eyepiece, using in an ordinary optical microscope. The surface morphology changes of carbon nanotubes can be directly observed through the lens.

The sample 81 is placed on the work stage 3, and the work stage 3 is configured for moving in an X-Y direction of a plane perpendicular to the observation tube 21. Through a movement in the X-Y direction, the morphology of the sample 81 thereon can be observed by the observation window 22. It is to be understood that carbon nanotubes can be selected to grow on a fixed/predetermined location of the sample 81, by the controlled/selected movement of the work stage 3.

The laser device 4 includes a laser apparatus 41 and a laser beam projection tube 42. The laser beam projection tube 42 has a first end and a second end distal/opposite to the first end. The first end of the laser beam projection tube 42 is connected, optically and mechanically, to the observation tube 21, and the second end of the laser beam projection tube 42 is connected, optically and mechanically, to the laser apparatus 41. The laser beam projection tube 42 includes a first focusing lens 421, a first light filtering sheet 422, a diffusing board 423, and a pinhole diaphragm 424, arranged in the order from the second end to the first end thereof. The route that the laser beam 411 travels upon emitting from the laser apparatus 41 until irradiating on the sample 81 is as follows. Firstly, the laser beam 411 emitting from the laser apparatus 41 arrives at the first focusing lens 421. Secondly, the laser beam 411 focused by the first focusing lens 421 passes through the first light filtering sheet 422 and the diffusing board 423 to focus on the pinhole diaphragm 424. The pinhole diaphragm 424 is arranged at the back focus of the first focusing lens 421. Thirdly, the laser beam 411 permeating the pinhole diaphragm 424 enters into the observation tube 21. Finally, after being reflected by the first half-reflecting, pellicle mirror 23, the laser beam 411 irradiates on the sample 81.

The lighting device 5 beneficially includes a lamp box 51 and a light projection tube 52. The light projection tube 52 has a first end and a second end distal/opposite to the first end. The first end of the light projection tube 52 is connected, optically and mechanically, to the observation tube 21. The second end of the light projection tube 52 is connected, optically and mechanically, to the lamp box 51. The lamp box 51 includes a shell 511 and a lamp 512. Rather usefully, the lamp 512 is a halide lamp, given the brightness and controllability of the light emitted thereby. The lamp 512 is installed in the shell 511. The light projection tube 52 includes a second focusing lens 521, a third focusing lens 522, and the second light filtering sheet 523, arranged in order from the second end to the first end. The route that the light emitted from the lamp 512 travels until irradiating on the sample 81 is as follows. Firstly, the light emitting from the lamp 512 passes through the second focusing lens 521 and the third focusing lens 523 to irradiate on the second light-filtering sheet 523. Secondly, the light filtered by the second light-filtering sheet 523 enters into the observation tube 21. After entering into the observation tube 21, the light irradiates on the second half-reflecting, pellicle mirror 24. Thirdly, the light reflected by the second half-reflecting, pellicle mirror 24 permeates the first half-reflecting, pellicle mirror 23 to irradiate on the sample 81. Fourthly, the light excited by the sample 81 returns to enter into the observation tube 21. Finally, after permeating the first half-reflecting, pellicle mirror 23 and the second half-reflecting, pellicle mirror 24, the light arrives at the CCD detector or the lens to be used to observe the morphology of the sample 81.

Moreover, a light absorption sheet 25 can be disposed between the second half-reflecting, pellicle mirror 24 and the observation window 22. The light absorption sheet 25 is used, advantageously, to absorb the laser beam reflected by the sample 81, thus avoiding damage of the CCD detector and/or the eyes of an observer. In addition, at least a fourth focusing lens 211 can be installed within the observation tube 21. Moreover, such a fourth focusing lens 211 is, opportunely, arranged under and separate from the first half-reflecting, pellicle mirror 23, spaced at a certain distance. The fourth focusing lens 211, given its placement/arrangement within the observation tube, can thus converge the laser beam 411 and the light emitting from the lamp 512. Accordingly, the focused laser beam 411 and the focused light irradiate on the sample 81.

In the present embodiment, the sample 81 placed on the work stage 3 is a substrate formed a catalyst layer thereon. The laser apparatus 41 can be selected from the group consisting of an argon ion laser, $CO_2$ laser semiconductor laser, and Nd/YAG laser, etc. A power of the above-described laser is in the approximate range from 50 milliwatts to 5000 watts. The irradiating scope of the focusing laser beam 411 on the substrate has an approximate diameter from 50 micrometers to 20 millimeters.

Figure 4:
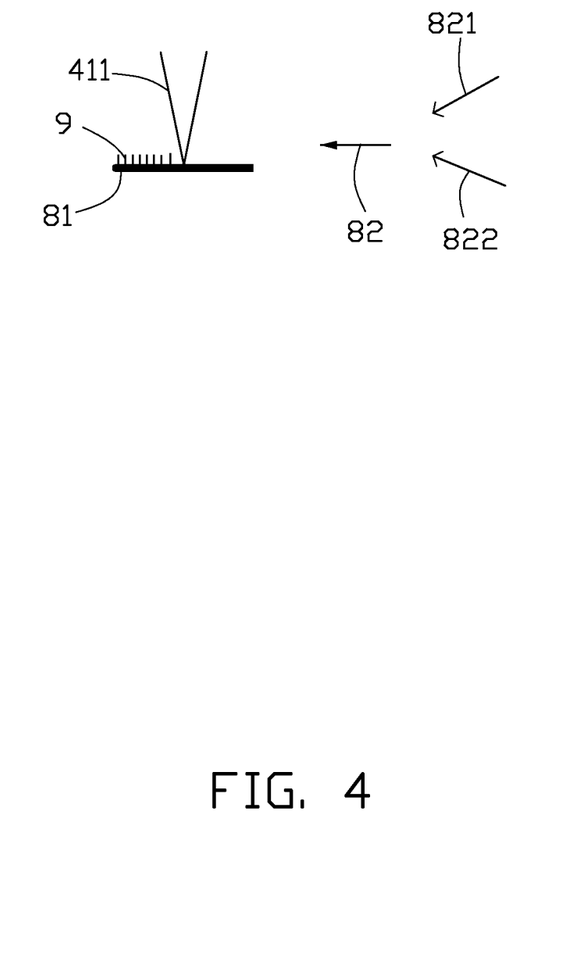
FIG. 4 is a schematic process chart to grow carbon nanotubes using the apparatus described in FIG. 2.

Referring to FIG. 4, a method for growing an array of carbon nanotubes using the apparatus 10 includes the following steps: (a) providing a substrate having a first surface and a second surface opposite to the first surface; (b) forming a catalyst film on the first surface of the substrate, the catalyst film including a first carbonaceous material (i.e., a carbon-carrying catalyst film); (c) flowing a mixture of a carrier gas and a carbon source gas across/over the catalyst film; and (d) irradiating the focused laser beam on the substrate to grow the array of carbon nanotubes from the substrate.

In step (a), the substrate 81 is, advantageously, made of a heat-resistant material (e.g., high-melting point, chemically durable), which can tolerate the high reaction temperature (e.g., upwards of about 600° C.). It is to be understood that depending on different applications, the material of the substrate 81 could be selected from various opaque or transparent materials, e.g. a group of opaque material consisting of silicon, silicon dioxide, and a metal for semiconductor electronical devices; and a group of transparent materials consisting of glass and plastic materials for flat displays.

In step (b), the catalyst film can be uniformly disposed on the first surface of the substrate 81 by means of thermal deposition, electron-beam deposition, or sputtering. The catalyst can, opportunely, be made of iron, gallium nitride, cobalt, nickel, or any combination alloy thereof. The step (b) can further include forming oxide catalyst particles through such means as high-temperature annealing.

In step (b), the catalyst film includes the first carbonaceous material, or a step (f) of forming a light absorption film is further provided before step (b), and the catalyst film is formed on the light absorption film on the first surface of the substrate.

In step (b), when the catalyst film includes the first carbonaceous material, the method for making the catalyst film including the first carbonaceous material includes the substeps of: (b1) providing a mixture of a dispersant and a first carbonaceous material; (b2) mixing/combining the mixture with a solvent to form a solution; (b3) ultrasonically agitating the solution to promote dispersing of the first carbonaceous material therein; (b4) adding a soluble catalyst material into the dispersed solution to form a catalyst solution; (b5) coating the catalyst solution on the first surface of the substrate 81; and (b6) baking the substrate 81 to form thereon the catalyst film including the first carbonaceous material (i.e., a carbon-carrying catalyst film).

In step (b1), the first carbonaceous material can be usefully selected from carbon black (CB) or/and graphite. The dispersant is used for uniformly dispersing the first carbonaceous material. Quite suitably, the dispersant is sodium dodecyl benzene sulfonate (SDBS). A weight ratio of the dispersant to the first carbonaceous material is, advantageously, in the approximate range from 1:2 to 1:10. In step (b2), the solvent, opportunely, is water or ethanol. In one useful embodiment, SDBS of greater than about 0 mg to about 100 mg (beneficially, a measurable amount of dispersant (i.e., above about 0 mg) is employed) and CB of about 100~500 mg can be mixed into ethanol of about 10~100 ml to form the solution. Quite usefully, the solution is formed by mixing SDBS of about 50 mg and CB of about 150 mg into ethanol of about 40 ml.

In step (b3), the solution can be sonicated (i.e., subjected to ultrasound) for, e.g., about 5 to 30 minutes to uniformly disperse the first carbonaceous material in the solution. In step (b4), the soluble catalyst material can, rather appropriately, include one or more metallic nitrate compounds selected from a group consisting of magnesium nitrate (Mg$(NO_3)_2.6H_2O$), iron nitrate (Fe$(NO_3)_3.9H_2O$), cobalt nitrate (Co$(NO_3)_2.6H_2O$), nickel nitrate (Ni$(NO_3)_2.6H_2O$), and any combination thereof. In one useful embodiment, after being treated with ultrasound for about 5 minutes, Fe$(NO_3)_3.9H_2O$ and Mg$(NO_3)_2.6H_2O$ is added to the solution, thereby forming the catalyst solution. Quite usefully, the catalyst solution includes about 0.01~0.5 Mol/L magnesium nitrate and about 0.01~0.5 Mol/L iron nitrate.

In step (b5), the catalyst solution is, beneficially, spin-coated on the substrate at a rotational speed of about 1000~5000 rpm. Quite suitably, the rotational speed for spin coating is about 1500 rpm. In step (b6), the substrate with the catalyst solution coated thereon is baked at about 60~100° C. for several tens of minutes (e.g., 10 min~1 hr). It is to be understood that the baking process is used to vaporize the solvent in the solution and accordingly form the catalyst film on the first surface of the substrate.

In step (b), wherein a step (f) of forming a light absorption film is further provided before step (b), and the catalyst film is formed on the light absorption film on the first surface of the substrate. Wherein step (f) further includes the substeps of: (f1) applying a second carbonaceous material layer onto the first surface of the substrate; (f2) gradually heating the substrate with the second carbonaceous material layer to about 300~450° C. for a time within in a range of about 60~90 minutes in an atmosphere of $N_2$ and/or another inert gas and baking the substrate with the second carbonaceous material thereon for about 15~20 minutes; and (f3) cooling down the substrate with the second carbonaceous material thereon to room temperature and thereby forming/yielding the light absorption layer on the first surface of the substrate.

In step (f1), the second carbonaceous material layer can be made of materials having merits of good electrical conductivity, strong adhesion with the substrate, and compatibility with high vacuum environment. Quite usefully, the second carbonaceous material is a commercially colloidal graphite inner coating (GIC) for CRTs. The second carbonaceous material can, beneficially, be spin-coated on the first surface of the substrate at a rotational speed of about 1000~5000 rpm. Quite suitably, the rotational speed for spin coating is about 1500 rpm. In step (f2), the baking process is, at least in part, to eliminate any impurities in the second carbonaceous material layer, such as the macromolecule material in the GIC. The thickness of the formed light absorption film is in the approximate range from 1 to 20 micrometers.

In step (b), wherein step (b) further includes the substeps of: (b7) providing a catalyst-ethanol solution; (b8) coating the catalyst-ethanol solution on the GIC layer to form the film of catalyst thereon.

In step (b7), the catalyst can, opportunely, be made of iron, gallium nitride, cobalt, nickel, or any combination alloy thereof. In step (b8), in one useful embodiment, a catalyst-ethanol solution is spin-coated (~1500 rpm) on the GIC layer to form the catalyst film. The catalyst-ethanol solution is a mixture solution of ethanol and one or more metallic nitrate compounds selected from a group consisting of magnesium nitrate (Mg$(NO_3)_2.6H_2O$), iron nitrate (Fe$(NO_3)_3.9H_2O$), cobalt nitrate (Co$(NO_3)_2.6H_2O$), nickel nitrate (Ni$(NO_3)_2.6H_2O$), and any combination thereof. Quite usefully, the catalyst-ethanol solution includes about 0.01~0.5 Mol/L magnesium nitrate and about 0.01~0.5 Mol/L iron nitrate. The thickness of the formed catalyst film is in the approximate range from 1 to 100 nanometers.

In step (c), a carbon source gas 821, which is combined with a carrier gas 822, is introduced as a gas flow across/adjacent the catalyst film. The carbon source gas 821 acts as a primary source of carbon for growing the carbon nanotubes. In one useful embodiment, the carbon source gas 821 and the carrier gas 822, in open air, are directly introduced by a nozzle to an area adjacent to the catalyst film. That is, the method can be operated without a closed reactor and/or without being under a vacuum. The carrier gas 822 can be a nitrogen ($N_2$) gas or a noble gas. The carbon source gas 821 can be ethylene ($C_2H_4$), methane ($CH_4$), acetylene ($C_2H_2$), ethane ($C_2H_6$), or any combination thereof. Quite suitably, the carrier gas 822 is argon (Ar), and the carbon source gas 821 is acetylene. A flow rate ratio of the carrier gas 822 to the carbon source gas 821 can be adjusted in the range from 1:5 to 100:1. Quite usefully, the argon flow-rate is 200 sccm (Standard Cubic Centimeter per Minute), and the acetylene flow-rate is 25 sccm.

In step (d), a specific process of irradiating the focused laser beam 411 on the surface of the substrate 81 occurs as follows. Firstly, the laser apparatus 41 is activated to emit the laser beam 411 therefrom, and the laser beam 411 travels through the laser beam projection tube 42 to irradiate on the first half-reflecting, pellicle mirror 23. Secondly, after redirection by the first half-reflecting, pellicle mirror 23, the laser beam 411 is converged by fourth focusing lens 211 to irradiate on the substrate 81. By the laser beam 411 irradiating on the substrate 81, the temperature of the substrate 81 reaches up to the predetermined/reacting temperature to grow carbon nanotubes. Thirdly, the mixed gases 82 containing the carbon source gas 821 and the carrier gas 822 flow over/across the surface of the substrate 81. Due to catalyzing by the catalyst film, the carbon source gas 821 supplied over the catalyst film is pyrolized in a gas phase into carbon units (C=C or C) and free hydrogen ($H_2$). The carbon units are absorbed on a free surface of the catalyst film and diffused into the catalyst film. When the catalyst film is supersaturated with the dissolved carbon units, carbon nanotube growth is initiated. As the intrusion/diffusion of the carbon units into the catalyst film continues, the array of carbon nanotubes 9 is formed. The additional hydrogen produced by the pyrolized reaction can help reduce the catalyst oxide and activate the catalyst. As such, the growth speed of the carbon nanotubes is increased, and the achievable height of the array of the carbon nanotubes is enhanced.

Moreover, in the process of growing carbon nanotube array 9, through the use of the apparatus for manufacturing carbon nanotubes 10, the in-situ growth of carbon nanotubes can be readily monitored. The process of using the apparatus for manufacturing carbon nanotubes 10 is described in detail. Firstly, the light emitting from the halide lamp 512 is directed through the light projection tube 52 to irradiate on the second light-filtering sheet 523. Secondly, the filtered light irradiates on the second half-reflecting, pellicle mirror 24. The light reflected by the second half-reflecting, pellicle mirror 24 passes through the first half-reflecting, pellicle mirror 23 and the fourth focusing lens 211 to irradiate on and illuminate the substrate 81. Thirdly, the light reflected by the substrate 81 subsequently passes through the fourth focusing lens 211, the first half-reflecting, pellicle mirror 23, the second half-reflecting, pellicle mirror 24, and the light absorption sheet 25 to reach the observation window 22. As such, the location and morphology of the carbon nanotube array 9 can be observed through/via the observation window 22. As such, the growth locations and morphology of the carbon nanotube array 9 can be observed and controlled by moving the work stage 3 (i.e., movement of the stage would change the current laser impact/heating point and the available field of view). It is to be understood that movement of the stage could be automatically controlled, to precisely control the resulting growth pattern (e.g., carbon nanotube height and growth location).

In one useful embodiment, a diameter of the focused laser beam 411 is in the approximate range from 50 to 200 micrometers. A pattern of carbon nanotubes array 9 can be manufactured by the above-described method. The catalyst film includes the carbonaceous material. The patterned of carbon nanotubes array 9 is synthesized by irradiating the focused laser beam 411 on the second surface of the substrate 81 for about 5 seconds. The formed array of carbon nanotube 9 manifests a hill-shaped morphology. The diameter of the hill is in the approximate range from 50 to 80 micrometers. The maximum height of the hill is in the approximate range from 10 to 20 micrometers. The diameter of each of carbon nanotubes is in the approximate range from 40 to 80 nanometers.

In another present embodiment, another array of carbon nanotubes manufactured by the present method is shown. A light absorption layer made of commercially colloidal graphite is formed between the catalyst film and the substrate. The array of carbon nanotubes is synthesized by irradiating the focused laser beam on the second surface of the substrate for about 30 seconds. The formed array of carbon nanotubes, in this example, manifests a hill-shaped morphology. The diameter of the hill is in the approximate range from 100 to 200 μm. The maximum height of the hill is in the approximate range from 10 to 20 μm. The diameter of each of carbon nanotubes is in the approximate range from 10 to 30 nanometers.

Compared with the current technology, using the apparatus for manufacturing carbon nanotubes 10 has the following advantages.

Firstly, the apparatus for manufacturing carbon nanotubes 10 employs a combination of the laser-induced chemical vapor deposition method and the capability of in-situ observation of carbon nanotubes growth. The apparatus 10 facilitates localized heating of the substrate for growing carbon nanotubes, rather than heating the whole substrate. Therefore, using the apparatus 10 for growing carbon nanotubes saves energy and does not require keeping a constant temperature in the whole reaction chamber. Reaction gases, similarly, do not need to permeate the entire reaction chamber. Thus, the size/complexity of the apparatus for growing carbon nanotubes and the usage amount of the reaction gases can be reduced.

Secondly, the in-situ observation of carbon nanotube growth can be realized by using the apparatus 10. The CCD detector is used to record the morphology and the growth location of the carbon nanotubes. Thus, the apparatus 10 enables monitoring, in real-time, the process of the carbon nanotube growth.

Thirdly, the ability to move the work stage 3 in a selectable manner permits control of the growth locations of carbon nanotubes. Thus, the carbon nanotubes formed on the substrate 81 can be patterned. It does not need a patterned catalyst layer formed on the substrate 81 to form the patterned array of carbon nanotubes. When the needed morphology of the carbon nanotubes is observed through the observation window 22, the laser beam 411 can be timely shuttered, the laser apparatus 41 can be turned off, and/or laser-beam generation can otherwise be interrupted. Therefore, the patterned carbon nanotubes using this method can easily be obtained, and using this method to form a patterned carbon nanotubes can simplify and, likely, speed the production process.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for manufacturing carbon nanotubes comprising:
   providing an apparatus comprising:
      an observation device comprising an observation tube, an observation window arranged on the top of the observation tube, a first half-reflecting pellicle mirror installed at an angle of 45° in the observation tube, and a second half-reflecting pellicle mirror installed parallel to the first half-reflecting pellicle mirror;
      a work stage disposed under and separated a certain distance from the observation tube;
      a laser device arranged perpendicular to the observation device and optically directed at the first half-reflecting pellicle mirror;

a lighting device arranged perpendicular to the observation device and optically directed at the second half-reflecting pellicle mirror;

providing a substrate have a first surface and a second surface opposite to the first surface;

forming a catalyst film on the first surface of the substrate, wherein the catalyst film comprises a carbonaceous material;

flowing a mixture of a carrier gas and a carbon source gas across the catalyst film; and irradiating a focused laser beam on the substrate to grow a carbon nanotube array from the substrate, wherein the catalyst film is configured to grow carbon nanotubes by heating the substrate locally, and the observation device is configured to observe the carbon nanotubes during the growth process.

2. The method of claim 1, wherein the forming the catalyst film on the first surface of the substrate comprises:

providing a mixture of a dispersant and a carbonaceous material;

mixing the mixture with a solvent to form a solution;

ultrasonically agitating the solution to promote dispersing the carbonaceous material therein;

adding a soluble catalyst material into the dispersed solution to form a catalyst solution;

coating the catalyst solution on the first surface of the substrate; and baking the substrate to form the catalyst film thereon.

3. The method of claim 2, wherein the dispersant is sodium dodecyl benzene sulfonate, and a weight ratio of the dispersant to the carbonaceous material is in a range from about 1:2 to about 1:10.

4. The method of claim 2, wherein the catalyst solution comprises about 0.01 to about 0.5 Mol/L magnesium nitrate and about 0.01 to about 0.5 Mol/L iron nitrate.

5. The method of claim 2, wherein the soluble catalyst material comprises one or more metallic nitrate compounds selected from the group consisting of magnesium nitrate ($Mg(NO_3)_2 \cdot 6H_2O$), iron nitrate ($Fe(NO_3)_3 \cdot 9H_2O$), cobalt nitrate ($Co(NO_3)_2 \cdot 6H_2O$), nickel nitrate ($Ni(NO_3)_2 \cdot 6H_2O$), and any combination thereof.

6. The method of claim 2, wherein the substrate with the catalyst solution coated thereon is baked at about 60 to about 100° C. for several tens of minutes.

7. The method of claim 2, wherein the carbonaceous material comprises a material selected from the group consisting of carbon black, graphite, and any combination thereof.

8. The method of claim 1, wherein the catalyst film comprises a material selected from the group consisting of iron, gallium nitride, cobalt, nickel, and any combination alloy thereof.

9. A method for manufacturing carbon nanotubes comprising:

providing an apparatus comprising:

an observation device comprising an observation tube, an observation window arranged on the top of the observation tube, a first half-reflecting pellicle mirror installed at an angle of 45° in the observation tube, and a second half-reflecting pellicle mirror installed parallel to the first half-reflecting pellicle mirror;

a work stage disposed under and separated a certain distance from the observation tube;

a laser device arranged perpendicular to the observation device and optically directed at the first half-reflecting pellicle mirror;

a lighting device arranged perpendicular to the observation device and optically directed at the second half-reflecting pellicle mirror;

providing a substrate having a first surface and a second surface opposite to the first surface;

forming a light absorption film on the first surface of the substrate;

forming a catalyst film on the light absorption film, wherein the catalyst film comprises a first carbonaceous material;

flowing a mixture of a carrier gas and a carbon source gas across the catalyst film; and irradiating a focused laser beam on the substrate to grow a carbon nanotube array from the substrate, wherein the catalyst film is configured to grow carbon nanotubes by heating the substrate locally, and the observation device is configured to observe the carbon nanotubes during the growth process.

10. The method of claim 9, wherein forming the light absorption film on the first surface of the substrate comprises:

applying a second carbonaceous material layer onto the first surface of the substrate;

gradually heating the substrate with the second carbonaceous material layer to about 300 to about 450° C. for about 60 to about 90 minutes in an atmosphere of $N_2$ and/or another inert gas and baking the substrate with the second carbonaceous material thereon for about 15 to about 20 minutes; and cooling down the substrate with the second carbonaceous material thereon to room temperature, thereby forming the light absorption layer on the first surface of the substrate.

11. The method of claim 10, wherein the second carbonaceous material layer is a colloidal graphite inner coating (GIC) layer.

12. The method of claim 11, wherein a thickness of the formed light absorption film is in a range from about 1 micrometer to about 20 micrometers.

13. The method of claim 11, wherein forming the catalyst film on the light absorption film comprises:

providing a catalyst-ethanol solution; and coating the catalyst-ethanol solution on the GIC layer to form the film of catalyst thereon.

14. The method of claim 13, wherein the catalyst-ethanol solution is a mixture solution of ethanol and one or more metallic nitrate compounds selected from the group consisting of magnesium nitrate ($Mg(NO_3)_2 \cdot 6H_2O$), iron nitrate ($Fe(NO_3)_3 \cdot 9H_2O$), cobalt nitrate ($Co(NO_3)_2 \cdot 6H_2O$), nickel nitrate ($Ni(NO_3)_2 \cdot 6H_2O$), and any combination thereof.

15. The method of claim 13, wherein the catalyst-ethanol solution comprises about 0.01 to about 0.5 Mol/L magnesium nitrate and about 0.01 to about 0.5 Mol/L iron nitrate.

* * * * *